United States Patent
Schulze et al.

(10) Patent No.: US 6,416,863 B1
(45) Date of Patent: Jul. 9, 2002

(54) METHOD FOR ENCAPSULATING SOLDER METAL POWDERS AND SOLDER METAL POWDERS PRODUCED ACCORDING TO THIS METHOD

(76) Inventors: Jürgen Schulze, Semmelweisstrasse 29, D-14482 Potsdam; Walter Protsch, Patrizierweg 67, D-14480 Potsdam, both of (DE)

( * ) Notice: Subject to any disclaimer, the term of this patent is extended or adjusted under 35 U.S.C. 154(b) by 0 days.

(21) Appl. No.: 09/719,281
(22) PCT Filed: Jun. 15, 1999
(86) PCT No.: PCT/DE99/01777
  § 371 (c)(1),
  (2), (4) Date: Dec. 7, 2000
(87) PCT Pub. No.: WO99/65640
  PCT Pub. Date: Dec. 23, 1999

(30) Foreign Application Priority Data

Jun. 15, 1998 (DE) .......................................... 198 26 756

(51) Int. Cl.⁷ .............................................. B32B 15/02
(52) U.S. Cl. .................. 428/402.21; 427/487; 427/532; 427/58; 427/123; 428/425.9; 524/801
(58) Field of Search ................................. 427/487, 532, 427/58, 123; 428/402.21, 425.9; 524/801

(56) References Cited

U.S. PATENT DOCUMENTS 3,736,653 A    6/1973    Maierson et al.
4,994,326 A    2/1991    Shimmura et al.

FOREIGN PATENT DOCUMENTS

DE    44 02 042 A1    6/1994
WO    WO 97/33713     9/1997

*Primary Examiner*—Samuel A. Acquah
(74) *Attorney, Agent, or Firm*—Herbert Dubno; Jonathan Myers

(57) ABSTRACT

A method is disclosed for encapsulating solder metal powders and the microencapsulated metal solder in such a way that the metal powder is reliably protected from external oxidizing influences and the capsule only releases the metal powder as a result of the influence of temperature, without the influence of soldering flux.

9 Claims, 1 Drawing Sheet

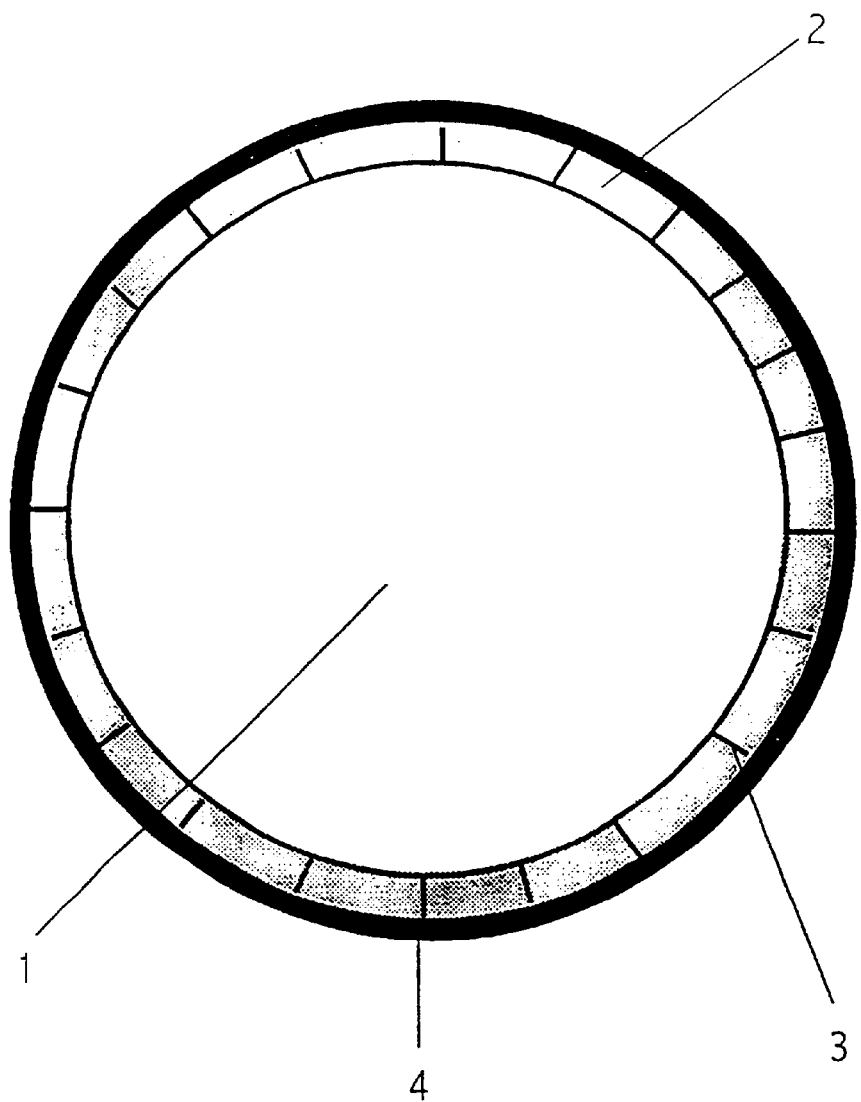
Fig.

METHOD FOR ENCAPSULATING SOLDER METAL POWDERS AND SOLDER METAL POWDERS PRODUCED ACCORDING TO THIS METHOD

The invention relates to a method of encapsulating solder metal powders, especially the finest solder metal powders, in which the powder is provided with a thin polymer protective layer by a polymerization reaction carried out on the surface of the solder powder.

The invention relates further to a solder metal powder produced by this method and having a core of solder metal with a diameter of 1 to 100 $\mu$m and a protective layer surrounding this core of polymer.

A method of this type for producing microparticles of a reflow soldering agent is known from DE 44 02 042 A1, in which the compact solder metal is melted in a high temperature organic liquid and is dispersed as spherically symmetrical particles in a particle size range of preferably 3 to 10 $\mu$m in a diameter by a flow dispersing process and the organic liquid is removed to the extent that the metal particulate remains coated, so that it can be transferred into an emulsion and the individual particles of the suspension and emulsion coated with a melamine polymer to a layer thickness in the range of 50 to 250 nm by the complex coacervation method. The microparticulate organic phase is then quantitatively separated from the microparticulate metal phase.

This microparticulized metal powder is indeed protected by a thermosetting plastic polymer system but can be liberated only by the use of a very strongly activated flux. This flux can give rise to damage to microelectronic circuits and is thus unsuitable.

A solder powder is, in addition, known from EP 0 556 864 A1 which is provided with a protective layer of parylenes. The parylene layer is applied by means of a vapor deposition whereby dimers are decomposed by pyrolysis to monomers, the monomers are condensed from the gas phase onto the surface of the powder particles and the monomers there undergo the polymerization reaction and film forming.

This known process has the disadvantage that for use of the particles in solder pastes, layers thicknesses of less than 100 nm is required and under these conditions there is no assurance that there will be complete encapsulation of all particles and the prior problem remains of a measurable permeability to small molecules which are detrimental to the solder powder like water, and gasses like oxygen and sulphur dioxide.

This known encapsulating material also has the drawback that it can be dissolved only with highly active fluxes. A use in soldering processes has thus not become known.

Faced with this state of the art, the invention has as its object the provision of a method and a microencapsulated solder which are improved in that the metal powder is reliably protected from external oxidative processes and simultaneously the encapsulation can liberate the metal powder without requiring fluxes and only by the effect of temperature.

This object is achieved by the following method steps.

a) producing a suspension of a powder and a hydrophobic liquid, b) generating a hydrophobic surface layer on each metal particle by the addition of a cationic tenside [surface active agent] with a chain length of $C_1$ to $C_{20}$ with continuous stirring to form a brush structure on the hydrophobic layer of step (a), c) stirring the mixture from steps (a) and (b) until a viscous homogeneous mass is formed, d) admixing a radically polymerizable monomer to the mass in step (c) and which is capable of forming a thermoplastic polymer with a glass temperature Tg of at least 60° C. below the solid temperature of the solder powder, e) adding an organic initiator to start an interfacial polymerization reaction incorporating the hydrophobic layer of step (a) and forming a protective layer of thermoplastic polymer that has flux characteristics, f) introducing the mass from step (e) into an aqueous system with continuous stirring, the system containing an emulsifier for suspension stabilization, and controlling the polymerization reaction by tempering [controlled temperature heating] to 50° to 90° C. and maintaining the mass at this temperature for at least 120 min, and g) cooling washing and recovering the solder power encapsulated in steps e) and f).

According to a further preferred feature of the method of the invention, as the hydrophobic liquid, nondrying vegetable and/or animal oils and/or aromatic solvents are used. Preferably vegetable oils, ricinus oil, olive oil or peanut oil is used.

In a further feature of the method of the invention, quaternary ammonium salts, preferably dodecyltrimethylammoniumchloride or cetyltrimethylammoniumchloride metal chloride is used as the tenside.

A preferred feature of the method of the invention utilizes as the monomer methacrylic acid-2-hydroxyethyl ester or methylmethacrylate.

To initiate the polymerization reaction, organic peroxides or azo compounds are used as initiators.

Furthermore, the object is achieved with a microencapsulated solder powder in which the metallic core is formed with a brush like structure with a surface active hydrophobic liquid and a tenside and in which a thermoplastic polymer encapsulating wall with fluxing agent characteristics is anchored, whereby the microencapsulating wall has a glass temperature $T_g$ of at least 60° C. below the solidus temperature of the core.

The hydrophobic layer on the metal core is composed, according to further feature of a nondrying vegetable and/or animal oil and/or aromatic solvent, preferably castor oil, olive oil or peanut oil and a cationic tenside with a chain link of $C_1$ to $C_{20}$ whose length determines the layer thickness of the encapsulating wall.

Suitable monomers for forming the encapsulating wall are radically polymerizable monomers, preferably methacrylic-2-hydroxyethylester or methylmethacrylate.

The encapsulation according to the invention protects the powder properties. Simultaneously the sheath ensures protection against the influences of atmospheric effects like oxidation, moisture and cover layer formation. The oxidative attack on the metal particles within the paste by activators is also limited. As a result there is an enhanced stability against undesired chemical reactions in solder pastes made therefrom. The use characteristics in terms of processability and storage stability of the pastes are clearly improved.

The encapsulation walls on the inorganic particles gives rise to a substantially improved coupling of these particles to the polymer matrix in applications such as paste or dyestuffs which leads to a reduced sedimentation tendency and improved rheological characteristics.

The polymer used has a glass temperature, i.e. the temperature at which the polymer makes a transition into the plastic state, of 60° to 70° C. This ensures that the polymer encapsulating sheath will free the metal powder before it melts and will not hinder the soldering process. By the choice of monomers according to the invention the encapsulating material has fluxing agent properties.

Further advantages and details are given in the following description with reference to the accompanying drawing.

The invention is subsequently explained in several examples in greater detail.

The associated drawing shows the principle of construction of a metal particle sheathed by the method according to the invention.

The metallic core has the reference numeral 1. Around the core 1 is a layer 2 of a nondrying vegetable oil, for example, castor oil which forms a hydrophobic boundary layer. From the core 1 projects the long chain tenside 3, for example dodecyltrimethylammoniumchloride, in a brush like structure.

In this structure the thermoplastic polymer capsule wall 4 is anchored.

EXAMPLE 1

For the microencapsulation according to the invention of the solder powder, about 100 to 200 g of solder is weighed with 15% oil. To the combination of a predetermined amount of a tenside solution is added. The amount of the tenside is dependent upon the type and in the case of dodecyltrimethylammoniumchloride is at least 0.053 mg per gram of solder. Generally an excess of the tenside with respect to the proportion of oil is not problematical at least within certain limits for the further process (110% of the theoretical quantity) with respect to the total mixture, has no adverse effect).

The solder-tenside-oil system is thereafter intensively mixed by stirring. When this mixture is homogeneous and forms a homogeneous mass, 1 to 4 mg of methacrylicacid-2-hydroxyethyl ester per gram of solder and 0.1 to 0.3 mg of benzoyl peroxide per gram of monomer are added and intensively mixed into the mixture.

In a glass beaker 600 to 800 ml of water to which 0.1 to 1.0 % of polyvinylpyrollidone K90 is added is prepared. This preparation is stirred with a dispersing apparatus, e.g. the Ultra-Turrax of the Firm IKA with a speed of 7200 r.p.m. To this preparation the solder-oil-tenside mixture is fed and the speed raised to 9000 r.p.m. Then the system is tempered to 55° C. This temperature is maintained for 90 minutes and is then raised to 65° C. The second reaction phase takes 120 min. The composition is cooled down to room temperature and the aqueous supernatant is decanted. The reaction vessel is flushed with a small amount of ethanol to enable a transfer to the final cleaning with dichloromethane.

After the alcohol has been poured out, the solder powder found at the bottom of the beaker is stirred in dichloromethane and transferred to a glass beaker. The "washing process" is repeated a number of times until the supernatant becomes clear. There follows a drying of the still moist solder powder at room temperature.

EXAMPLE 2

250g of solder powder is mixed with 14 mg of cetyltrimethylanmoniumchloride, 09 g methyl methacrylate and 260 mg benzoyl peroxide in 40 g of peanut oil. This reaction mixture is introduced into 600 ml water and suspended at 9000 r.p.m. As soon as a homogenous suspension is reached, one tempers it to 60° C. After 90 min one raises the temperature by 10 degrees and maintains this temperature constant for 120 min. The system is cooled and further processed corresponding to Example 1.

The meaning of the reference characteristics used:

| | |
|---|---|
| Metallic core | 1 |
| Oil layer | 2 |
| Tenside | 3 |
| Polymer encapsulating wall | 4 |

What is claimed is:

1. A method of encapsulating solder metal powder in which the powder is provided with a thin polymer protective layer by a polymerization reaction running on the surface of the solder powder, with the following steps:

a) producing a suspension of powder and a hydrophobic liquid, b) generating a hydrophobic surface layer on each metal particle by adding a cationic tenside with a chain length of $C_1$ through $C_{20}$ with continuous stirring to form a brush structure on the hydrophobic layer of step (a), c) stirring the mixture of steps a) and b) until formation of a viscous homogeneous mass, d) adding a radically polymerizable monomer to the mass of step c) and which forms a thermoplastic polymer with a glass temperature Tg of at least 60° C. below the solidus temperature of the solder powder, e) adding an organic initiator to start an interfacial polymerization reaction with incorporation of the hydrophobic layer of step b) and formation of a protective layer of thermoplastic polymer which has fluxing agent characteristics, f) introducing the mass of step e) into an aqueous preparation with continuous stirring, whereby the preparation contains an emulsifier for suspension stabilization and controlling the polymerization reaction by tempering to 50° to 90° C. and maintaining this temperature for at least 120 min, and g) cooling, washing and recovering the encapsulated solder powder of steps e) and f).

2. The method according to claim 1 characterized in that as the hydrophobic liquid a nondrying vegetable and/or animal oil and/or aromatic solvent in used.

3. The method according to claim 1 characterized in that as the tenside a quaternary ammonium salt is used.

4. The process according to claim 1 characterized in that as the monomer methacrylicacid-2-hydroxyethylester or methylmethacrylate is used.

5. The method according to claim 1 characterized in that an the initiator, an organic peroxide or azo compound is used.

6. A microencapsulated solder powder for carrying out the method according to claim 1 with a core of solder metal of a diameter of 100 µm and a polymer layer surrounding the metal core, whereby the core is formed with a brush like structure by a surface active hydrophobic liquid and a tenside in which a thermoplastic polymer capsule wall is mechanically anchored and has fluxing agent characteristics, and whereby the polymer capsule wall has a glass temperature Tg of at least 60° C. below the solidus temperature of the core.

7. A microencapsulated solder powder according to claim 6 characterized in that the hydrophobic liquid in a nondrying vegetable and/or animal oil and/or aromatic solvent.

8. A microencapsulated solder powder according to claim 6 characterized in that the tenside is a cationic tenside with a chain length of $C_1$ to $C_{20}$ whose length determined the layer thickness of the polymer layer.

9. A microencapsulated solder powder according to claim 6 characterized in that the polymer is formed from a radically polymerizable monomer.

* * * * *